(12) United States Patent
Harada et al.

(10) Patent No.: US 9,255,344 B2
(45) Date of Patent: Feb. 9, 2016

(54) SILICON CARBIDE SUBSTRATE AND METHOD OF MANUFACTURING THE SAME

(75) Inventors: Shin Harada, Osaka (JP); Shinsuke Fujiwara, Itami (JP); Taro Nishiguchi, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 826 days.

(21) Appl. No.: 13/605,265

(22) Filed: Sep. 6, 2012

(65) Prior Publication Data

US 2013/0071643 A1 Mar. 21, 2013

Related U.S. Application Data

(60) Provisional application No. 61/537,176, filed on Sep. 21, 2011.

(30) Foreign Application Priority Data

Sep. 21, 2011 (JP) .................. 2011-205513

(51) Int. Cl.
| | |
|---|---|
| *C30B 23/00* | (2006.01) |
| *C30B 29/36* | (2006.01) |
| *C30B 35/00* | (2006.01) |
| *H01L 21/02* | (2006.01) |

(52) U.S. Cl.
CPC ............... *C30B 23/005* (2013.01); *C30B 29/36* (2013.01); *C30B 35/007* (2013.01); *H01L 21/02378* (2013.01); *H01L 21/02433* (2013.01); *H01L 21/02529* (2013.01); *H01L 21/02631* (2013.01)

(58) Field of Classification Search
CPC .... C30B 23/005; C30B 29/36; C30B 35/007; H01L 21/02378; H01L 21/02529; H01L 21/02631
USPC ........ 428/220; 117/85, 106, 951; 501/88, 154
See application file for complete search history.

(56) References Cited

U.S. PATENT DOCUMENTS

| | | | |
|---|---|---|---|
| 7,294,324 B2 | 11/2007 | Powell et al. | |
| 7,314,520 B2 | 1/2008 | Powell et al. | |
| 7,314,521 B2 | 1/2008 | Powell et al. | |

FOREIGN PATENT DOCUMENTS

JP          2008-115036 A     5/2008

*Primary Examiner* — Aaron Austin
*Assistant Examiner* — Lawrence Ferguson
(74) *Attorney, Agent, or Firm* — Drinker Biddle & Reath LLP (57) ABSTRACT

A silicon carbide substrate capable of stably forming a device of excellent performance, and a method of manufacturing the same are provided. A silicon carbide substrate is made of a single crystal of silicon carbide, and has a width of not less than 100 mm, a micropipe density of not more than 7 $cm^{-2}$, a threading screw dislocation density of not more than $1\times10^4$ $cm^{-2}$, a threading edge dislocation density of not more than $1\times10^4$ $cm^{-2}$, a basal plane dislocation density of not more than $1\times10^4$ $cm^{-2}$, a stacking fault density of not more than 0.1 $cm^{-1}$, a conductive impurity concentration of not less than $1\times10^{18}$ $cm^{-3}$, a residual impurity concentration of not more than $1\times10^{16}$ $cm^{-3}$, and a secondary phase inclusion density of not more than 1 $cm^{-3}$.

13 Claims, 9 Drawing Sheets

SILICON CARBIDE SUBSTRATE AND METHOD OF MANUFACTURING THE SAME

This application claims the benefit of U.S. Provisional Application No. 61/537,176 filed Sep. 21, 2011, which is incorporated by reference herein in the entirety.

BACKGROUND OF THE INVENTION

1. Field of the Invention

The present invention relates to silicon carbide substrates and methods of manufacturing the same, and more particularly to a silicon carbide substrate capable of forming a device of excellent performance, and a method of manufacturing the same.

2. Description of the Background Art

A silicon carbide substrate has been used to manufacture a semiconductor device in recent years. Silicon carbide has a wider band gap than silicon, which is a more common material. Thus, a semiconductor device including a silicon carbide substrate has advantages including high breakdown voltage, low on-resistance, and high resistance to performance degradation in a high temperature environment.

It has been conventionally proposed to use a silicon carbide substrate having a reduced density of crystal defects, in order to realize a semiconductor device of excellent performance as described above. For example, U.S. Pat. No. 7,314,520 discloses a silicon carbide substrate having a screw dislocation density of less than about 2000 $cm^{-2}$. U.S. Pat. No. 7,314,521 discloses a silicon carbide substrate having a diameter of at least about 100 mm and a micropipe density of less than about 25 $cm^{-2}$. U.S. Pat. No. 7,294,324 discloses a silicon carbide substrate having a diameter of at least about 75 mm and at least one continuous square inch (6.25 $cm^2$) of surface area that has a basal plane dislocation density of less than about 500 $cm^{-2}$.

As a result of diligent studies by the present inventors, however, it has been found difficult to stably improve the performance of a device formed on a silicon carbide substrate by suppressing only the defects disclosed in these prior art documents. In addition, these prior art documents merely disclose general methods of manufacturing a silicon carbide substrate, and it is difficult to stably manufacture silicon carbide substrates having a low defect density as described above with these methods.

SUMMARY OF THE INVENTION

The present invention was made to solve such problems, and an object of the present invention is to provide a silicon carbide substrate capable of stably forming a device of excellent performance, and a method of manufacturing the same.

A silicon carbide substrate according to the present invention is made of a single crystal of silicon carbide, and has a width of not less than 100 mm, a micropipe density of not more than 7 $cm^{-2}$, a threading screw dislocation density of not more than $1 \times 10^4$ $cm^{-2}$, a threading edge dislocation density of not more than $1 \times 10^4$ $cm^{-2}$, a basal plane dislocation density of not more than $1 \times 10^4$ $cm^{-2}$, a stacking fault density of not more than 0.1 $cm^{-1}$, a conductive impurity concentration of not less than $1 \times 10^{18}$ $cm^{-3}$, a residual impurity concentration of not more than $1 \times 10^{16}$ $cm^{-3}$, and a secondary phase inclusion density of not more than 1 $cm^{-3}$.

With these features, when an epitaxial layer made of silicon carbide is formed on a main surface of the silicon carbide substrate, the density of defects that affect the performance of a device including the epitaxial layer can be reliably reduced, thereby improving the device performance.

The width (e.g., diameter) of the silicon carbide substrate is set to not less than 100 mm, in order to lower the cost of manufacturing the device. The width of the silicon carbide substrate is preferably not less than 120 mm, and more preferably not less than 150 mm. The micropipe density is set to not more than 7 $cm^{-2}$, in order to prevent a photoresist from reaching a back surface of the silicon carbide substrate during application of the photoresist in the process of manufacturing the device. The micropipe density is preferably not more than 5 $cm^{-2}$, and more preferably not more than 3 $cm^{-2}$. The lower limit of the micropipe density is 0.01 $cm^{-2}$ due to manufacturing limitations and the like.

The threading screw dislocation density is set to not more than $1 \times 10^4$ $cm^{-2}$, in order to improve a breakdown voltage yield of the device.

The threading edge dislocation density is set to not more than $1 \times 10^4$ $cm^{-2}$, in order to improve a breakdown voltage yield of the device.

The basal plane dislocation density is set to not more than $1 \times 10^4$ $cm^{-2}$, in order to improve long-term reliability of the device.

The stacking fault density is set to not more than 0.1 $cm^{-1}$, in order to improve a breakdown voltage yield of the device. The stacking fault density is preferably not more than 0.05 $cm^{-1}$, and more preferably not more than 0.03 $cm^{-1}$. The lower limit of the stacking fault density is 0.001 $cm^{-1}$ due to manufacturing limitations and the like.

The conductive impurity concentration is set to not less than $1 \times 10^{18}$ $cm^{-3}$, in order to suppress increase in on-resistance during production of a vertical device. The conductive impurity concentration is preferably not less than $5 \times 10^{18}$ $cm^{-3}$, and more preferably not less than $1 \times 10^{19}$ $cm^{-3}$. The upper limit of the conductive impurity concentration is $1 \times 10^{21}$ $cm^{-3}$ in terms of crystallinity of the silicon carbide substrate.

The residual impurity concentration is set to not more than $1 \times 10^{16}$ $cm^{-3}$, in order to suppress increase in various types of defects associated with absorption of a residual impurity into the silicon carbide substrate. The lower limit of the residual impurity concentration is $1 \times 10^{14}$ $cm^{-2}$ due to manufacturing limitations and the like.

The secondary phase inclusion density is set to not more than 1 $cm^{-3}$, in order to suppress increase in various types of defects associated with the secondary phase inclusions. The secondary phase inclusion density is preferably not more than 0.5 $cm^{-3}$, and more preferably not more than 0.3 $cm^{-3}$. The lower limit of the secondary phase inclusion density is 0.01 $cm^{-3}$ due to manufacturing limitations and the like.

A method of manufacturing a silicon carbide substrate according to the present invention includes the steps of preparing a seed crystal substrate made of a single crystal of silicon carbide, preparing source powder of silicon carbide to be grown on a surface of the seed crystal substrate, and growing silicon carbide on the surface of the seed crystal substrate by sublimation by placing the seed crystal substrate and the source powder in a processing container. In the step of growing silicon carbide, vibration applied to the processing container is set such that its frequency has a maximum value of 10 Hz and its amplitude has a maximum value of 1 mm.

The present inventors have found that vibration applied to a processing container during growth of silicon carbide introduces defects resulting from the vibration into a grown silicon carbide layer. Specifically, when vibration is applied to a processing container, the shape of a surface of source powder placed in the processing container may vary due to the vibration, causing silicon carbide to be formed on the surface of a seed crystal substrate under growth conditions that are not optimal conditions. The vibration may also stir up part of the source powder in the processing container, causing the occurrence of defects in formed silicon carbide. In order to prevent the occurrence of these problems, it is effective to control the maximum values of the frequency and amplitude of vibration applied to the processing container as described above.

In order to control the frequency and amplitude of vibration in this manner, the following apparatus configuration can be employed, for example. Specifically, a processing container is arranged on a fixing member such as a vibration isolation table, and a pump connected to the processing container for generating vibration is also arranged on a vibration isolation table. In addition, the pump is arranged sufficiently away from the processing container. A tank serving as a buffer is arranged in a path of pipes connecting the pump to the processing container.

The maximum value of the frequency of vibration is set to 10 Hz, because vibration having a low frequency is readily transmitted, and thus readily affects a manufactured silicon carbide substrate. The frequency is preferably not more than 7 Hz, and more preferably not more than 5 Hz. The maximum value of the amplitude of vibration is set to 1 mm, in order to minimize effect of the vibration on various parameters of crystal growth. The amplitude is preferably not more than 0.5 mm, and more preferably not more than 0.2 mm.

According to the present invention, a silicon carbide substrate with reduced defects which is capable of forming a device of excellent performance can be obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described below with reference to the drawings. It is noted that the same or corresponding parts are designated by the same reference numerals in the following drawings, and description thereof will not be repeated.

Figure 1:
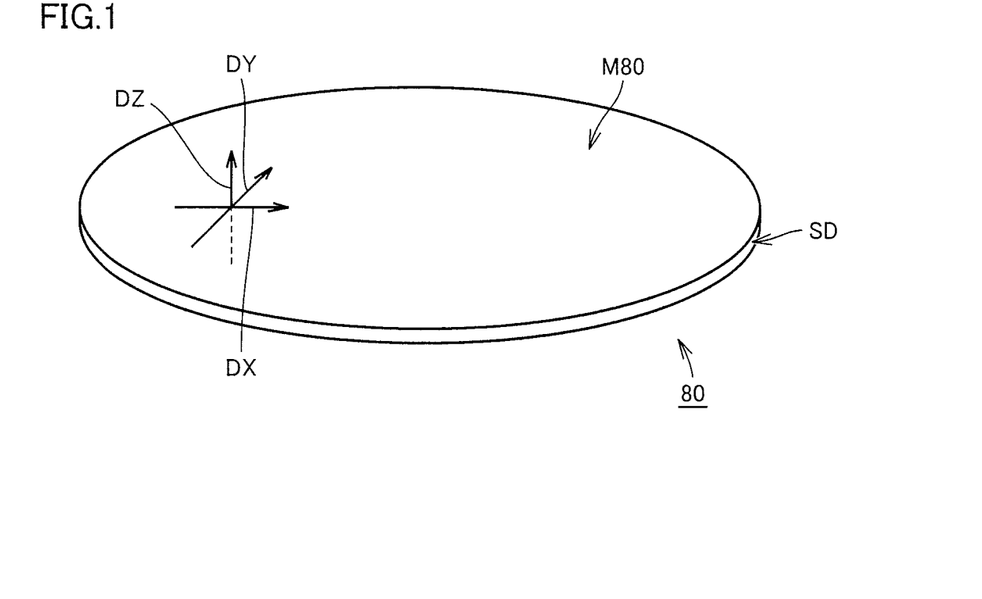
FIG. 1 is a schematic perspective view showing a silicon carbide substrate in a first embodiment of the present invention.

As shown in FIG. 1, a silicon carbide substrate 80 in this embodiment is a single crystal substrate made of silicon carbide having a hexagonal crystal structure. Silicon carbide substrate 80 has a side surface SD, and a main surface M80 surrounded by side surface SD. The polytype of the hexagonal crystal is preferably 4H.

Figure 2:
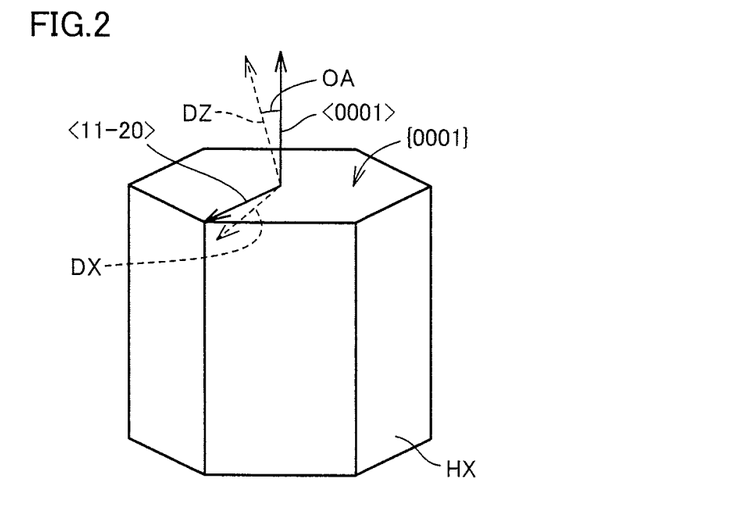
FIG. 2 is a schematic perspective view showing a crystal structure of the silicon carbide substrate in FIG. 1 together with its off angle off orientation.

In addition, as shown in FIG. 2, main surface M80 (FIG. 1) may be tilted by an off angle OA relative to a {0001} plane of hexagonal crystal HX. That is, a normal direction DZ of main surface M80 may be tilted by off angle OA relative to a <0001> direction. This tilt is provided in an off direction DX. In FIG. 1, a direction DY is a direction perpendicular to direction DX in main surface M80. Off direction DX corresponds to a <11-20> direction in the {0001} plane in this embodiment.

Silicon carbide substrate 80 according to the present invention is made of a single crystal of silicon carbide as described above, and has a width of not less than 100 mm, a micropipe density of not more than 7 $cm^{-2}$, a threading screw dislocation density of not more than $1 \times 10^4$ $cm^{-2}$, a threading edge dislocation density of not more than $1 \times 10^4$ $cm^{-2}$, a basal plane dislocation density of not more than $1 \times 10^4$ $cm^{-2}$, a stacking fault density of not more than 0.1 $cm^{-1}$, a conductive impurity concentration of not less than $1 \times 10^{18}$ $cm^{-3}$, a residual impurity concentration of not more than $1 \times 10^{16}$ $cm^{-3}$, and a secondary phase inclusion density of not more than 1 $cm^{-3}$.

With these features, when an epitaxial layer made of silicon carbide is formed on main surface M80 of silicon carbide substrate 80, the density of defects that affect the performance of a device including the epitaxial layer can be reliably reduced, thereby improving the device performance.

The width (e.g., diameter) of silicon carbide substrate 80 is set to not less than 100 mm, in order to lower the cost of manufacturing the device. The width of silicon carbide substrate 80 is preferably not less than 120 mm, and more preferably not less than 150 mm. The micropipe density is set to not more than 7 $cm^{-2}$, in order to prevent a photoresist from reaching a back surface of silicon carbide substrate 80 during application of the photoresist in the process of manufacturing the device. The micropipe density is preferably not more than 5 $cm^{-2}$, and more preferably not more than 3 $cm^{-2}$. The lower limit of the micropipe density is 0.01 $cm^{-2}$ due to manufacturing limitations and the like.

The threading screw dislocation density is set to not more than $1\times10^4$ cm$^{-2}$, in order to improve a breakdown voltage yield of the device.

The threading edge dislocation density is set to not more than $1\times10^4$ cm$^{-2}$, in order to improve a breakdown voltage yield of the device.

The basal plane dislocation density is set to not more than $1\times10^4$ cm$^{-2}$, in order to improve long-term reliability of the device.

The stacking fault density is set to not more than 0.1 cm$^{-1}$, in order to improve a breakdown voltage yield of the device. The stacking fault density is preferably not more than 0.05 cm$^{-1}$, and more preferably not more than 0.03 cm$^{-1}$. The lower limit of the stacking fault density is 0.001 cm$^{-1}$ due to manufacturing limitations and the like.

The conductive impurity concentration is set to not less than $1\times10^{18}$ cm$^{-3}$, in order to suppress increase in on-resistance during production of a vertical device. The conductive impurity concentration is preferably not less than $5\times10^{18}$ cm$^{-3}$, and more preferably not less than $1\times10^{19}$ cm$^{-3}$. The upper limit of the conductive impurity concentration is $1\times10^{21}$ cm$^{-3}$ in terms of crystallinity of the silicon carbide substrate.

The residual impurity concentration is set to not more than $1\times10^{16}$ cm$^{-3}$, in order to suppress increase in various types of defects associated with absorption of a residual impurity into silicon carbide substrate 80. The lower limit of the residual impurity concentration is $1\times10^{14}$ cm$^{-3}$ due to manufacturing limitations and the like.

The secondary phase inclusion density is set to not more than 1 cm$^{-3}$, in order to suppress increase in various types of defects associated with the secondary phase inclusions. The secondary phase inclusion density is preferably not more than 0.5 cm$^{-3}$, and more preferably not more than 0.3 cm$^{-3}$. The lower limit of the secondary phase inclusion density is 0.01 cm$^{-3}$ due to manufacturing limitations and the like.

The micropipe density, threading screw dislocation density, threading edge dislocation density, and basal plane dislocation density can be measured by performing molten KOH etching or gas etching on silicon carbide substrate 80, and then observing etch pits formed in the surface of silicon carbide substrate 80.

The stacking fault density can also be measured by performing molten KOH etching or gas etching on silicon carbide substrate 80, and then observing etch pits formed in the surface of silicon carbide substrate 80.

The conductive impurity concentration and residual impurity concentration can be measured by secondary ion mass spectrometry (SIMS).

A method of manufacturing silicon carbide substrate 80 shown in FIG. 1 will now be described with reference to FIGS. 3 to 14.

Figure 3:
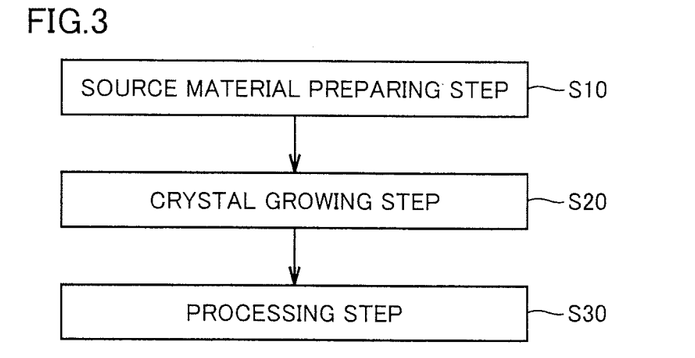
FIG. 3 is a flowchart illustrating a method of manufacturing the silicon carbide substrate in FIG. 1.

In the method of manufacturing silicon carbide substrate 80 shown in FIG. 1, first, as shown in FIG. 3, a source material preparing step (S10) is performed. As will be described alter, this source material preparing step includes a step of preparing source powder of silicon carbide and a step of preparing a seed crystal substrate.

Figure 4:
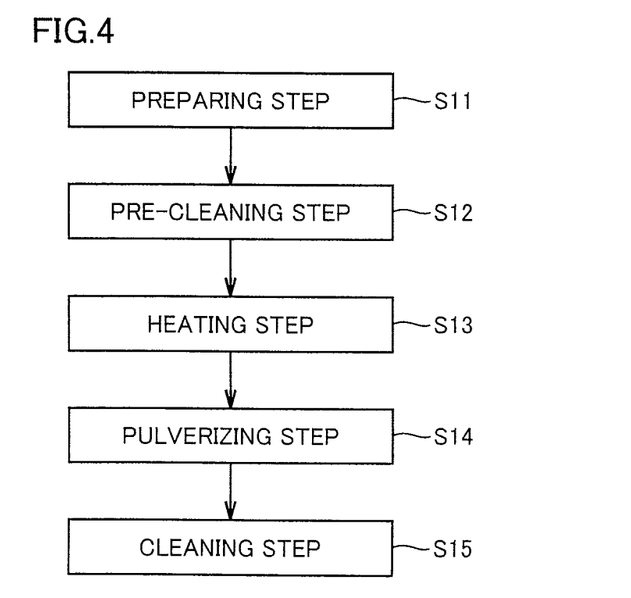
FIG. 4 is a flowchart illustrating a source material preparing step in FIG. 3.
Figure 5:
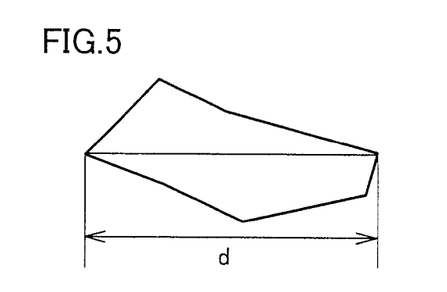
FIG. 5 is a schematic plan view of an example of a small piece of silicon used in the present invention.

The step of preparing source powder includes steps as shown in FIG. 4, for example. The step of preparing source powder is described below.

First, as shown in FIG. 4, a preparing step (S11) is performed. Specifically, small pieces of silicon and carbon powder, which are materials for the source powder of silicon carbide, are prepared. Preferably, the small pieces of silicon and carbon powder to be used are of high purity. Next, a pre-cleaning step (S12) is performed. In this step (S12), any of conventionally well-known cleaning steps is performed to remove foreign matters adhered to the small pieces of silicon and carbon powder. The pre-cleaning step (S12) may not be performed depending on the quality of the small pieces of silicon and carbon powder.

Next, a step of producing a mixture by mixing the small pieces of silicon and carbon powder that have been subjected to the pre-cleaning step (S12) is performed.

The step of producing a mixture can be performed by placing both of the small pieces of silicon and carbon powder in a crucible (e.g., crucible made of graphite), and mixing them in the crucible to produce a mixture. The mixture can be produced by mixing the small pieces of silicon and carbon powder before placing them in the crucible. It is preferable to use a small piece of silicon having a diameter d of not less than 0.1 mm and not more than 5 cm, and more preferably not less than 1 mm and not more than 1 cm, as shown in a schematic plan view of FIG. 5, for example. In this case, silicon carbide powder of high purity including silicon carbide all the way inside tends to be obtained. In the present specification, the term "diameter" refers to the length of the longest line segment out of line segments connecting arbitrary two points on a surface.

It is preferable to use carbon powder having an average particle size (average value of diameters of individual carbon powders) of not less than 10 μm and not more than 200 μm. In this case, silicon carbide powder of high purity including silicon carbide all the way inside tends to be obtained.

Figure 14:
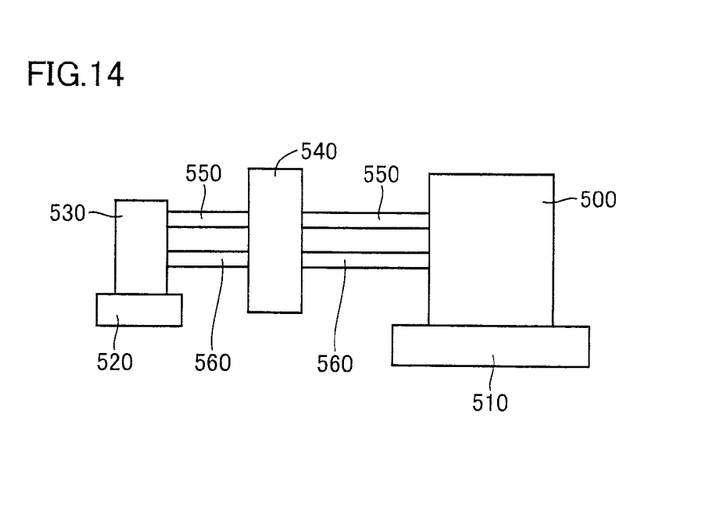
FIG. 14 is a block diagram illustrating the configuration of a crystal growth apparatus used in the crystal growing step in FIG. 3.

Next, a heating step (S13) shown in FIG. 14 is performed. Specifically, a step of producing a silicon carbide powder precursor by heating the produced mixture to not less than 2000° C. and not more than 2500° C. is performed. The step of producing a silicon carbide powder precursor can be performed by heating the mixture of the small pieces of silicon and carbon powder placed in the crucible to a temperature of not less than 2000° C. and not more than 2500° C. in an inert gas atmosphere at a pressure of not less than 1 kPa and not more than $1.02\times10^5$ Pa, particularly not less than 10 kPa and not more than 70 kPa. As a result, silicon of the small pieces of silicon reacts with carbon of the carbon powder in the crucible to form silicon carbide which is a compound thereof, to produce a silicon carbide powder precursor.

If the heating temperature is less than 2000° C., the reaction between silicon and carbon does not proceed inside because the heating temperature is too low, resulting in inability to produce a silicon carbide powder precursor of high impurity including silicon carbide all the way inside. If the heating temperature is more than 2500° C., the reaction between silicon and carbon proceeds too much because the heating temperature is too high. This causes desorption of silicon from the silicon carbide formed by the reaction between silicon and carbon, resulting in inability to produce a silicon carbide powder precursor of high impurity including silicon carbide all the way inside.

The inert gas to be used may contain at least one element selected from the group consisting of argon, helium and nitrogen.

Preferably, a heating time period of the mixture of the small pieces of silicon and carbon powder is not less than 1 hour and not more than 100 hours. In this case, the silicon tends to react sufficiently with carbide to produce an excellent silicon carbide powder precursor.

Preferably, a step of reducing the pressure of the atmosphere is performed after the heating. In this case, silicon carbide further tends to be formed all the way inside of each silicon carbide crystal particle forming the silicon carbide powder precursor to be described later.

If the pressure of the atmosphere is to be reduced to not more than 10 kPa in the step of reducing the pressure of the atmosphere, a time period during which the pressure is reduced is preferably not more than 10 hours, more preferably not more than 5 hours, and still more preferably not more than 1 hour. If the time period during which the pressure is reduced is not more than 10 hours, more preferably not more than 5 hours, and particularly not more than 1 hour, desorption of silicon from the silicon carbide formed by the reaction between silicon and carbon tends to be suitably suppressed, to produce an excellent silicon carbide powder precursor.

After the pressure of the atmosphere has been reduced to not more than 10 kPa as described above, the silicon carbide powder precursor may be cooled to room temperature (25° C.) after the pressure of the atmosphere is increased to not less than 50 kPa by supplying inert gas or the like, or the silicon carbide powder precursor may be cooled to room temperature (25° C.) while the pressure of not more than 10 kPa is maintained. It is noted that the silicon carbide powder precursor is an aggregate of a plurality of silicon carbide crystal particles, which is formed of the individual silicon carbide crystal particles connected to one another.

Next, a pulverizing step (S14) shown in FIG. 4 is performed. Specifically, the silicon carbide powder precursor thus produced is pulverized to produce silicon carbide powder. This step (S14) can be performed by pulverizing the silicon carbide powder precursor, which is an aggregate of a plurality of silicon carbide crystal particles, with an ingot of a single crystal or polycrystal of silicon carbide, or a tool coated with a single crystal or polycrystal of silicon carbide.

Next, a cleaning step (S15) shown in FIG. 4 is performed. Specifically, the silicon carbide powder is cleaned with aqua regia, for example. Preferably, such cleaning step (S15) is performed particularly after the silicon carbide powder precursor has been pulverized with a tool not including a single crystal or polycrystal of silicon carbide. For example, if the silicon carbide powder precursor is pulverized with a tool made of steel, metal impurities such as iron, nickel and cobalt tend to be mixed into or adhere to the pulverized silicon carbide powder. It is thus preferable to clean the powder with the above acid to remove such metal impurities.

The silicon carbide powder thus produced tends to be constituted of silicon carbide not only on its surface but also inside thereof, and is substantially made of silicon carbide. Being substantially made of silicon carbide means that not less than 99% by mass of the silicon carbide powder is constituted of silicon carbide.

Instead of forming the silicon carbide precursor as described above, silicon carbide powder may be prepared as source powder. In this case as well, a step of cleaning the source powder with aqua regia may be performed as described above. In this case, impurities in the source powder can be readily removed. Next, the step of preparing a seed crystal substrate included in the source material preparing step (S10) is described.

Figure 6:
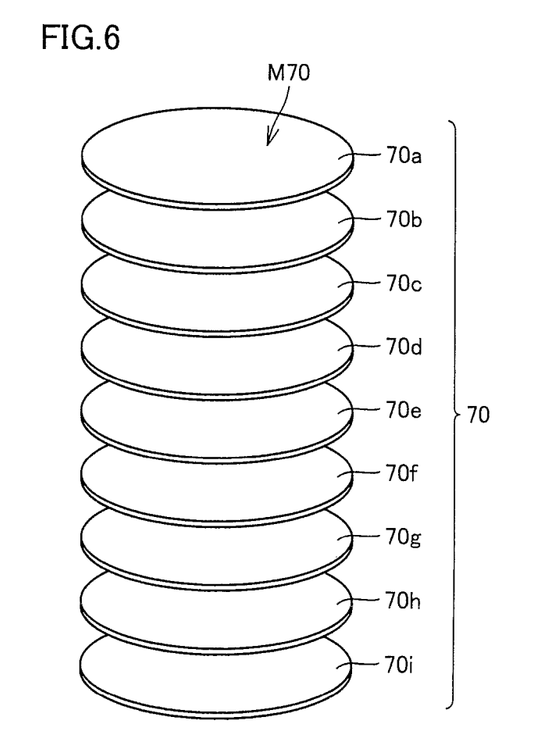
FIG. 6 is a schematic perspective view illustrating a step of preparing a seed crystal substrate in the source material preparing step in FIG. 3.

First, a step of preparing a plurality of silicon carbide single crystals each having a main surface is performed. Specifically, as shown in FIG. 6, silicon carbide single crystals 70a to 70i (also collectively referred to as 70) each having a main surface M70, which are candidate materials for the seed crystal substrate, are prepared. Silicon carbide single crystals 70 have a hexagonal crystal structure, and preferably have a 4H polytype. Main surface M70 has a plane orientation corresponding to a plane orientation of main surface M80 (FIG. 1) of silicon carbide substrate 80 shown in FIG. 1, for example. Each of silicon carbide single crystals 70 has a thickness (vertical dimension in the figure) of not less than 0.7 mm (700 µm) and not more than 10 mm, for example. Each of silicon carbide single crystals 70 has a circular planar shape, for example, and a diameter of preferably not less than 25 mm, and more preferably not less than 100 mm. Main surface of M70 of each of silicon carbide single crystals 70 is preferably tilted relative to a (0001) plane. As a result, in a crystal growing step (S20) of growing silicon carbide to be described later, step-flow growth can be readily maintained on main surface M70 of a seed crystal substrate 70S.

Figure 7:
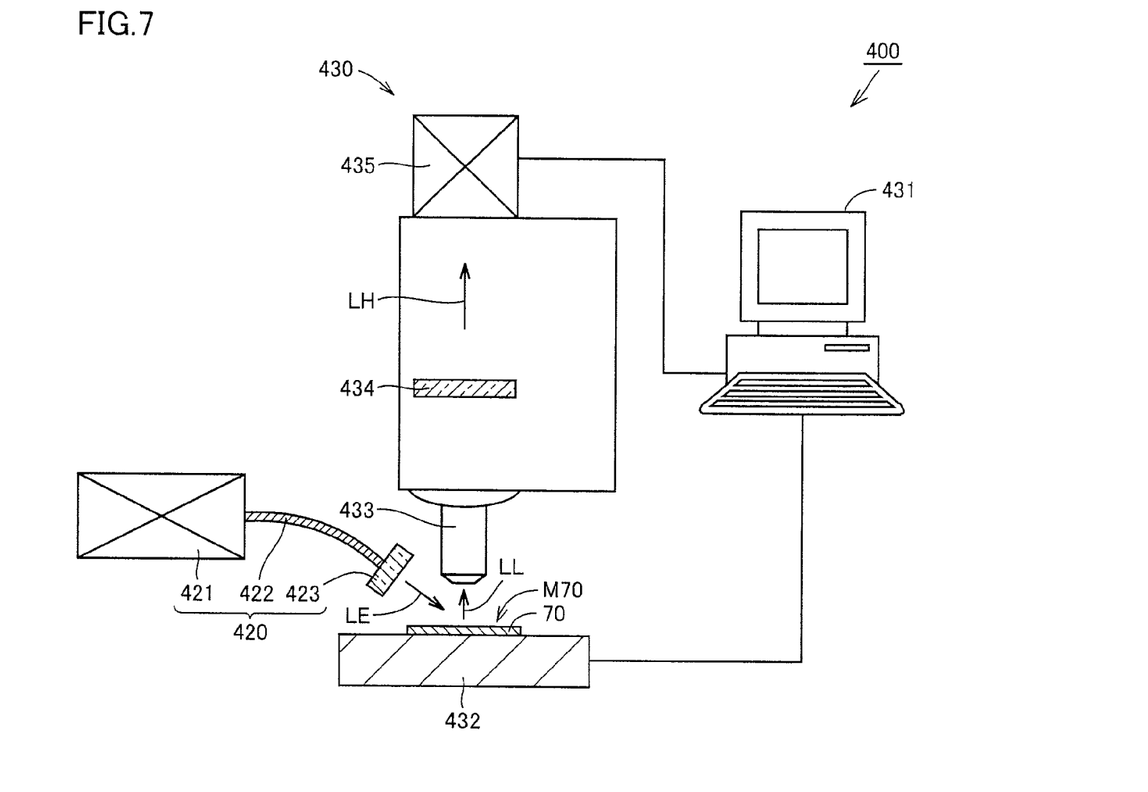
FIG. 7 is a block diagram illustrating the step of preparing a seed crystal substrate in the source material preparing step in FIG. 3.
Figure 8:
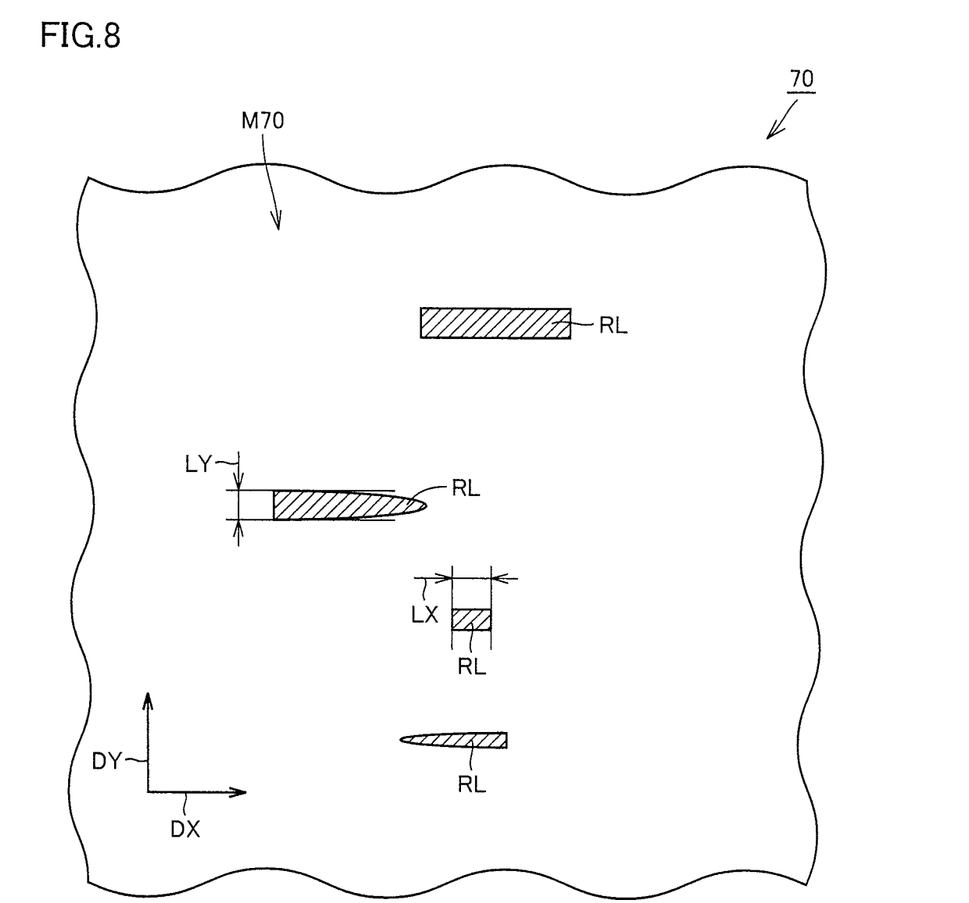
FIG. 8 is a partial plan view illustrating the step of preparing a seed crystal substrate in the source material preparing step in FIG. 3.

Next, a step of measuring the density of defects in each of silicon carbide single crystals 70 by conducting photoluminescence measurement of main surface M70 of each of silicon carbide single crystals 70 is performed. Specifically, as shown in FIGS. 7 and 8, photoluminescence measurement is conducted on main surface M70 of each of silicon carbide single crystals 70a to 70i. As a result, characteristic values to be described later are calculated.

A measurement apparatus used for the photoluminescence measurement is described. As shown in FIG. 7, a photoluminescence measurement apparatus 400 includes an excitation light production unit 420 and a microscope unit 430.

Excitation light production unit 420 includes a light source unit 421, a light guide unit 422, and a filter 423. Light source unit 421 is a light source including a component of energy higher than the band gap of hexagonal silicon carbide, and is a mercury lamp, for example. Light guide unit 422 guides light emitted from light source unit 421, and includes an optical fiber, for example. Filter 423 selectively allows transmission of light having a specific wavelength corresponding to energy higher than the band gap of hexagonal silicon carbide. A wavelength of about 390 nm typically corresponds to the band gap of hexagonal silicon carbide. Thus, a band-pass filter that particularly allows transmission of light having a wavelength of about 313 nm can be used as filter 423. With this configuration, excitation light production unit 420 can emit excitation light LE having energy higher than the band gap of hexagonal silicon carbide.

Microscope unit 430 includes a control unit 431, a stage 432, an optical system 433, a filter 434, and a camera 435. Control unit 431 controls operation of moving the position of stage 432 and imaging operation by camera 435, and is a personal computer, for example. Stage 432 supports each of silicon carbide single crystals 70 to expose main surface M70 and moves the position of main surface M70, and is an XY stage, for example. Optical system 433 receives photoluminescence light LL radiated from main surface M70 due to excitation by excitation light LE. Filter 434 selectively allows transmission of light having a wavelength of not less than 750 nm of the light received by optical system 433, and is a low-pass filter or band-pass filter. Camera 435 picks up an image by transmitted light LH that has been transmitted through filter 434 and transmits data thereof to control unit 431, and is a CCD camera, for example.

Next, a method of using photoluminescence measurement apparatus 400 is described.

Excitation light LE is emitted into main surface M70 of each of silicon carbide single crystals 70. As a result, photoluminescence light LL is produced on main surface M70. Transmitted light LH that has been transmitted through filter 434 of photoluminescence light LL is observed as an image by camera 435. Namely, a luminous region of photoluminescence light LL having a wavelength of more than 750 nm is observed on main surface M70.

As shown in FIG. 8, maximum dimensions LX and LY along directions DX and DY, respectively, are calculated for each luminous region RL. The number of luminous regions RL having a dimension LX of not more than a value obtained by dividing an intrusion length of excitation light LE into hexagonal silicon carbide by the tangent of off angle OA (see FIG. 2), and having a dimension LY of not more than 15 μm is determined. This number is then divided by an area (cm²) of a portion of main surface M70 that has been observed. A resultant value is a characteristic value serving as an index of photoluminescence characteristics of main surface M70 of each of silicon carbide single crystals 70.

The intrusion length refers to a length perpendicular to the observed main surface, and a length at which the intensity of light that has entered the main surface is attenuated to a ratio of 1/e (e being a Napier's number).

Next, a step of comparing the measured values (characteristic values mentioned above) of the density of defects obtained in the measuring step with a predetermined criterion to determine any of silicon carbide single crystals 70 satisfying the criterion as a seed crystal substrate is performed. Specifically, any of silicon carbide single crystals 70 having the characteristic value smaller than a prescribed value is determined as seed crystal substrate 70S (see FIG. 9). This prescribed value (criterion) is set to $1 \times 10^4$ cm$^{-2}$, for example.

Next, a step of connecting seed crystal substrate 70S thus determined to a pedestal 41 serving as a base member is performed. Specifically, first, the surface roughness of a back surface (surface opposite to main surface M70) of seed crystal substrate 70S is increased. This process can be performed by polishing the back surface of seed crystal substrate 70S with abrasive grains having a sufficiently large grain size. The grain size distribution of the abrasive grains has a component of preferably not less than 16 μm. The abrasive grains have an average grain size of preferably not less than 5 μm and not more than 50 μm, more preferably not less than 10 μm and not more than 30 μm, and still more preferably 12 to 25 μm.

The abrasive grains are preferably diamond grains. The abrasive grains are preferably dispersed in slurry for use. Thus, the polishing is preferably performed with diamond slurry. Diamond slurry including diamond grains having an average grain size of not less than 5 μm and not more than 50 μm, and having a component of not less than 16 μm in the grain size distribution is generally readily available.

Instead of performing the step of increasing the surface roughness of the back surface of seed crystal substrate 70S as described above, seed crystal substrate 70S may be formed with a back surface having a sufficiently high surface roughness from the beginning, and used without polishing of the back surface. Specifically, the back surface of seed crystal substrate 70S formed by slicing with a wire saw may be used without being polished. Namely, an as-sliced surface formed by slicing and not polished thereafter may be used as the back surface. The abrasive grains described above are used preferably for slicing with a wire saw.

Figure 9:
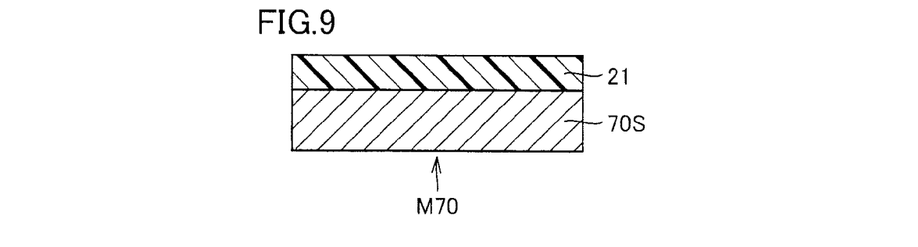
FIG. 9 is a schematic cross-sectional view illustrating the step of preparing a seed crystal substrate in the source material preparing step in FIG. 3.

Next, as shown in FIG. 9, a cover film 21 containing carbon is formed on the back surface of seed crystal substrate 70S. Preferably, cover film 21 has a surface roughness lower than that of the back surface of seed crystal substrate 70S on which cover film 21 is formed.

Preferably, this formation is performed by applying a liquid material, and more preferably, this liquid material does not include a solid matter such as fine particles. As a result, thin cover film 21 can be readily and uniformly formed.

Cover film 21 is an organic film in this embodiment. This organic film is preferably made of organic resin. Examples of the organic resin to be used include various types of resins such as acrylic resin, phenolic resin, urea resin, and epoxy resin, as well as photosensitive resin that is cross-linked or decomposed by the action of light. The photosensitive resin to be used may be a positive or negative photoresist used to manufacture a semiconductor device, and may be applied with a well-established technique using spin coating. Thus, the thickness of cover film 21 can be readily controlled. The spin coating is performed as follows, for example.

First, seed crystal substrate 70S is adsorbed on a holder. Seed crystal substrate 70S is rotated by rotation of this holder at a predetermined rotational speed. After a photoresist is dropped on rotating seed crystal substrate 70S, the rotation is continued for a predetermined time period to apply a thin and uniform photoresist. In order to ensure the uniformity on the entire surface of seed crystal substrate 70S, the rotational speed is set to 1000 to 10000 rotations per minute, the time period is set to 10 to 100 seconds, and the application thickness is set to not less than 0.1 μm.

Then, the applied photoresist is dried and hardened. A drying temperature and time period may be selected as appropriate depending on the material and application thickness of the photoresist. Preferably, the drying temperature is not less than 100° C. and not more than 400° C., and the drying time period is not less than 5 minutes and not more than 60 minutes. If the drying temperature is 120° C., for example, a time period required for volatilization is about 15 minutes for a thickness of 5 μm, 8 minutes for a thickness of 2 μm, and 3 minutes for a thickness of 1 μm.

Although cover film 21 can be formed by performing the application and drying steps once, cover layer 21 having a greater thickness may be formed by repeating these steps. It is not preferable to repeat the steps too many times since it requires more than enough time. It is usually preferable to repeat the steps only about two or three times.

Figure 10:
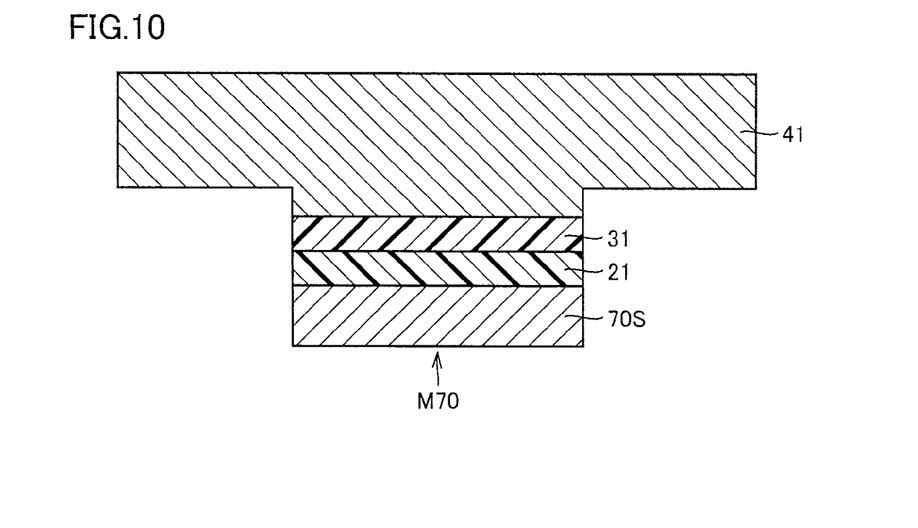
FIG. 10 is a schematic cross-sectional view illustrating the step of preparing a seed crystal substrate in the source material preparing step in FIG. 3.

Next, as shown in FIG. 10, pedestal 41 having a mounting surface on which seed crystal substrate 70S is to be mounted is prepared. This mounting surface includes a surface preferably made of carbon. Pedestal 41 is made of graphite, for example. The mounting surface is preferably polished to improve flatness thereof.

Next, cover film 21 is brought into contact with pedestal 41 with an adhesive 31 interposed therebetween. Preferably, this contact is established by pressing them against each other at a temperature of not less than 50° C. and not more than 120° C., and at a pressure of not less than 0.01 Pa and not more than 1 MPa. If adhesive 31 is provided so as not to protrude from a region sandwiched between seed crystal substrate 70S and pedestal 41, adverse effect caused by adhesive 31 can be suppressed, in a step of growing a single crystal using seed crystal substrate 70S to be described later.

Adhesive 31 preferably includes resin that is carbonized by heating to become non-graphitizable carbon, heat-resistant fine particles, and a solvent, and more preferably further includes carbohydrate. Examples of the resin to become non-graphitizable carbon include novolac resin, phenolic resin, and furfuryl alcohol resin.

The heat-resistant fine particles have the function of uniformly distributing the non-graphitizable carbon through a fixing layer that is formed by heating adhesive 31 to a high temperature, to increase a filling rate in the fixing layer. Examples of a material to be used for the heat-resistant fine particles include heat-resistant materials including carbon (C) such as graphite, silicon carbide (SiC), boron nitride (BN), and aluminum nitride (AlN). Other than these materials, high melting point metal, or a compound such as carbide or nitride thereof can be used. Examples of the high melting point metal to be used include tungsten (W), tantalum (Ta), molybdenum (Mo), titanium (Ti), zirconium (Zr), and hafnium (Hf). The heat-resistant fine particles have a particle size of 0.1 to 10 μm, for example. Examples of the carbohydrate to be used include a saccharide or a derivative thereof.

The saccharide may be a monosaccharide such as glucose, or a polysaccharide such as cellulose.

A solvent capable of dissolving and dispersing the resin and carbohydrate is selected as appropriate as the solvent. The solvent is not limited to be constituted of a single type of liquid, but may be a mixed liquid of a plurality of types of liquids. For example, a solvent including alcohol that dissolves carbohydrate and cellosolve acetate that dissolves resin may be used.

A ratio among the resin, carbohydrate, heat-resistant fine particles, and solvent in adhesive 31 is selected as appropriate to obtain suitable bonding and fixing strength of seed crystal substrate 70S. Adhesive 31 may include a component other than those described above, and may include an additive such as a surface-active agent and a stabilizer. The application amount of adhesive 31 is preferably not less than 10 mg/cm$^2$ and not more than 100 mg/cm$^2$. The thickness of adhesive 31 is preferably not more than 100 µm, and preferably not more than 50 µm.

Next, adhesive 31 is preferably prebaked. A prebaking temperature is preferably not less than 150° C.

Preferably, pedestal 41 is made of a material having a Young's modulus of not less than 10 GPa, a bending strength of not less than 40 MPa, and a tensile strength of not less than 30 MPa. Preferably, pedestal 41 has a thickness (e.g., thickness of a portion of pedestal 41 directly facing seed crystal substrate 70S in FIG. 10) of not less than 15 mm.

Figure 11:
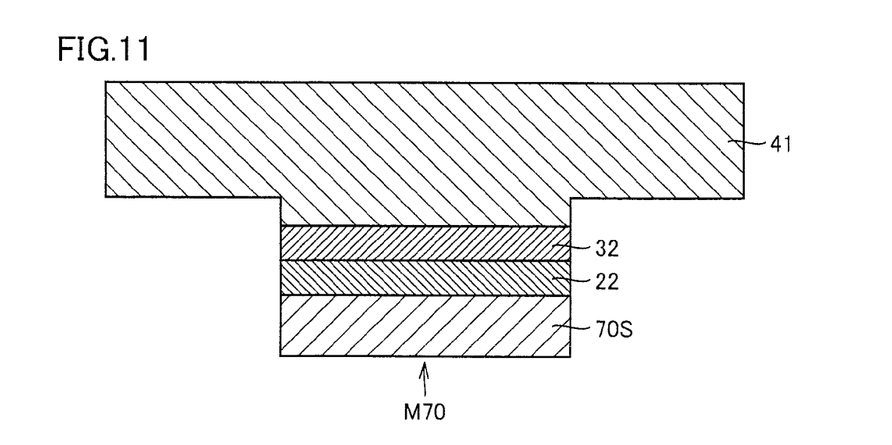
FIG. 11 is a schematic cross-sectional view illustrating the step of preparing a seed crystal substrate in the source material preparing step in FIG. 3.

Next, as shown in FIG. 11, cover film 21 and adhesive 31 (FIG. 10) are heated. By this heating, cover film 21 is carbonized to become a carbon film 22. Namely, carbon film 22 is provided on seed crystal substrate 70S. Moreover, by this heating, adhesive 31 is cured to become a fixing layer 32 between carbon film 22 and pedestal 41. As a result, seed crystal substrate 70S is fixed on pedestal 41.

Preferably, the heating is performed at a temperature of not less than 800° C. and not more than 1800° C. for a time period of not less than 1 hour and not more than 10 hours, at a pressure of not less than 0.13 kPa and not more than atmospheric pressure in an inert gas atmosphere. Examples of the inert gas to be used include helium, argon, and nitrogen gas.

Although cover film 21 is carbonized while adhesive 31 is cured in the above step, cover film 21 may be carbonized before adhesive 31 is formed.

Figure 12:
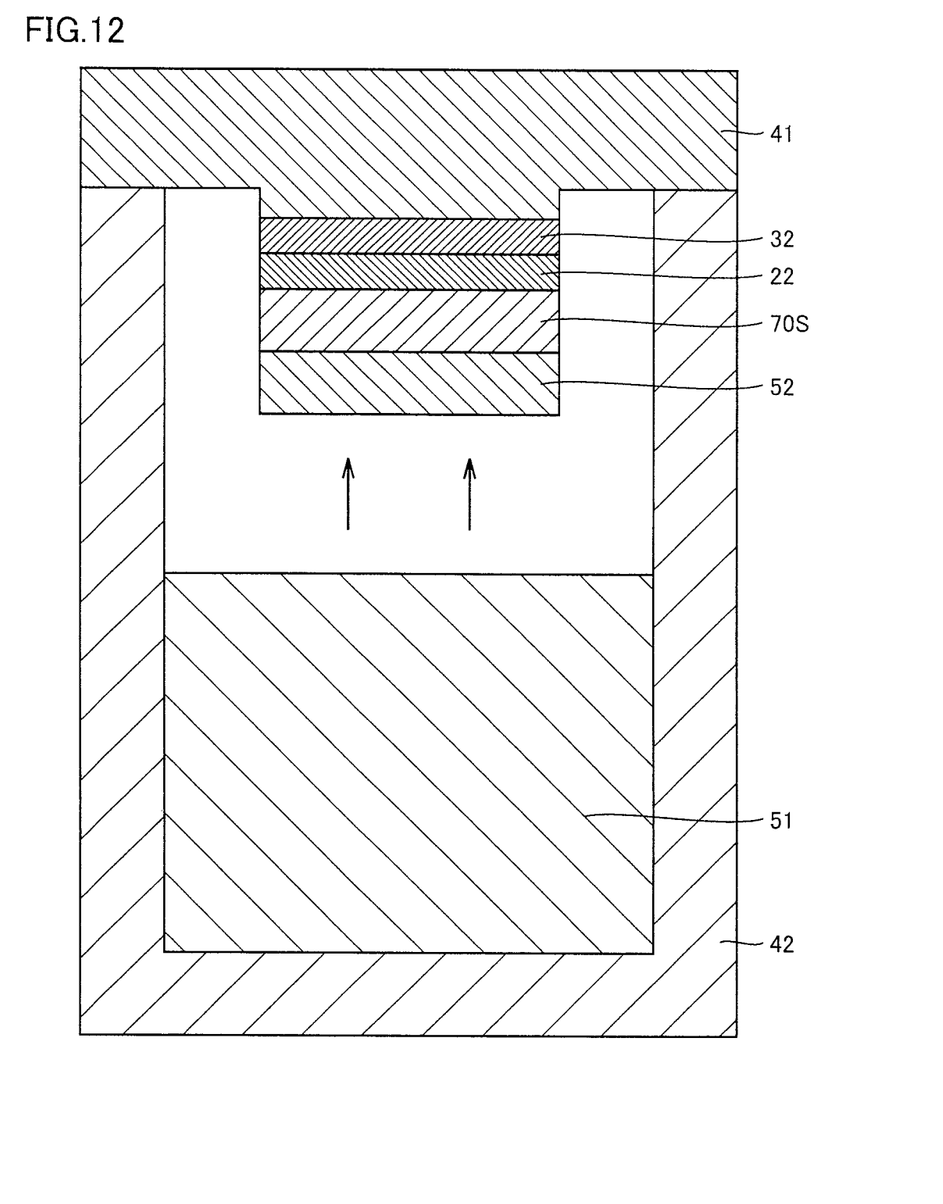
FIG. 12 is a schematic cross-sectional view illustrating a crystal growing step in FIG. 3.

Next, the crystal growing step (S20) shown in FIG. 3 is performed. Specifically, as shown in FIG. 12, a source material 51 is placed in a crucible 42. Source material 51 is the silicon carbide powder prepared in the source material preparing step (S10), for example. Crucible 42 is made of graphite, for example. Then, pedestal 41 is mounted on crucible 42 so that seed crystal substrate 70S faces inside of crucible 42. Pedestal 41 may serve as a lid of crucible 42, as shown in FIG. 12.

Next, source material 51 is sublimated as indicated with arrows in FIG. 12 and recrystallized on seed crystal substrate 70S, to deposit a sublimate on seed crystal substrate 70S. As a result, an ingot 52 is formed on seed crystal substrate 70S. A temperature for sublimating and recrystallizing the silicon carbide is not less than 2100° C. and not more than 2500° C., for example. In addition, a thermal gradient is provided in crucible 42 so that seed crystal substrate 70S has a temperature lower than that of source material 51. The pressure in crucible 42 is preferably not less than 1.3 kPa and not more than atmospheric pressure, and more preferably not more than 13 kPa in order to increase a growth rate. Ingot 52 of silicon carbide is thus formed.

Vibration applied to crucible 42 serving as a processing container is set such that its frequency has a maximum value of 10 Hz and its amplitude has a maximum value of 1 mm. Specifically, as shown in FIG. 14, a processing container 500 including crucible 42 (see FIG. 12) is arranged on a fixing member such as a vibration isolation table 510, and a pump 530 connected to processing container 500 for generating vibration is also arranged on a vibration isolation table 520. Pump 530 is used to transfer a cooling medium, or to control the pressure of atmosphere in processing container 500. In addition, pump 530 is arranged sufficiently away from processing container 500. A tank 540 storing the cooling medium or gas and serving as a buffer is arranged in a path of pipes 550 and 560 connecting pump 530 to processing container 500. With this configuration, the maximum values of the frequency and amplitude of vibration applied to processing container 500 can be controlled, thereby obtaining a high-quality silicon carbide substrate.

Figure 13:
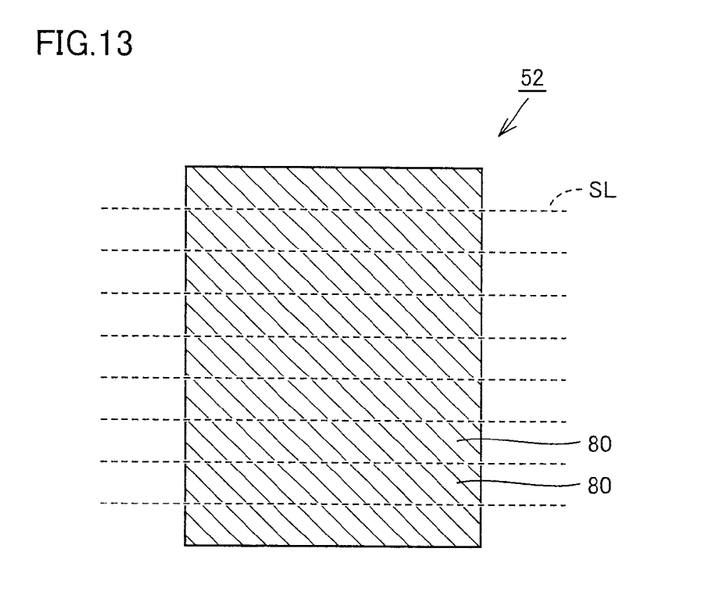
FIG. 13 is a schematic cross-sectional view illustrating a processing step in FIG. 3.

Next, a processing step (S30) shown in FIG. 3 is performed. Specifically, as shown in FIG. 13, ingot 52 is sliced. As a result, silicon carbide substrate 80 (FIG. 1) which is a single crystal substrate is obtained.

Although some of them have been described in the embodiment above, the characteristic features of the present invention will be listed below.

Silicon carbide substrate 80 according to the present invention is made of a single crystal of silicon carbide, and has a width of not less than 100 mm, a micropipe density of not more than 7 cm$^{-2}$, a threading screw dislocation density of not more than $1\times10^4$ Cm$^{-2}$, a threading edge dislocation density of not more than $1\times10^4$ cm$^{-2}$, a basal plane dislocation density of not more than $1\times10^4$ cm$^{-2}$, a stacking fault density of not more than 0.1 cm$^{-1}$, a conductive impurity concentration of not less than $1\times10^{18}$ cm$^{-3}$, a residual impurity concentration of not more than $1\times10^{16}$ cm$^{-3}$, and a secondary phase inclusion density of not more than 1 cm$^{-3}$.

With these features, when an epitaxial layer made of silicon carbide is formed on the main surface of silicon carbide substrate 80, the density of defects that affect the performance of a device including the epitaxial layer can be reliably reduced, thereby improving the device performance.

The method of manufacturing a silicon carbide substrate according to the present invention includes the step of preparing a seed crystal substrate made of a silicon carbide single crystal (source material preparing step (S10)), the step of preparing source powder of silicon carbide to be grown on a surface of the seed crystal substrate (source material preparing step (S10) in FIG. 3 and steps (S11 to S15) in FIG. 4), and the step of growing silicon carbide (ingot 52) on the surface of seed crystal substrate 70S by sublimation by placing seed crystal substrate 70S and source powder (source material 51) in a processing container (crucible 42 or processing container 500 including crucible 42) (crystal growing step (S20)). In the step of growing silicon carbide, vibration applied to the processing container is set such that its frequency has a maximum value of 10 Hz and its amplitude has a maximum value of 1 mm.

With this method, when vibration is applied to crucible 42 during the growth of silicon carbide, the occurrence of problems such as introduction of defects resulting from the vibration into grown ingot 52 can be suppressed.

In order to control the frequency and amplitude of vibration in this manner, the following apparatus configuration can be employed, for example. Specifically, as shown in FIG. 14, processing container 500 is arranged on a fixing member such as vibration isolation table 510, and pump 530 connected to processing container 500 for generating vibration is also arranged on vibration isolation table 520. In addition, the pump is arranged sufficiently away from processing container

500. Tank 540 serving as a buffer is arranged in a path of pipes 550 and 560 connecting pump 530 to processing container 500.

In the above method of manufacturing a silicon carbide substrate, the step of preparing source powder (source material preparing step (S10)) may include the step of preparing powder containing silicon carbide (step (S11) to step (S14) in FIG. 4), and the step of cleaning the powder with aqua regia (cleaning step (S15) in FIG. 4).

In this case, the concentration of impurities (residual impurities) in the source powder (source material 51) can be reliably reduced.

In the above method of manufacturing a silicon carbide substrate, the step of preparing powder containing silicon carbide (source material preparing step (S10)) may include the step of heating a mixture of small pieces of silicon and carbon powder (heating step (S13) in FIG. 4), and the step of pulverizing the mixture after the heating step to obtain powder (pulverizing step (S14) in FIG. 4). Preferably, the small pieces of silicon and carbon powder to be used are of particularly high purity. For example, the small pieces of silicon may have a purity of not less than 99.9999% by mass. The carbon powder may have a purity of not less than 99.99% by mass.

In the above method of manufacturing a silicon carbide substrate, in the step of preparing a seed crystal substrate (source material preparing step (S10)), an off substrate having a main surface (main surface M70) tilted relative to the (0001) plane may be prepared as seed crystal substrate 70S.

In this case, in the step of growing silicon carbide (crystal growing step (S20)), step-flow growth can be readily maintained on main surface M70 of seed crystal substrate 70S. Thus, the occurrence of defects in a formed silicon carbide layer can be suppressed. In the step of growing silicon carbide (crystal growing step (S20)), it is preferable to make a heat flux distribution between seed crystal substrate 70S and the source powder (source material 51) as uniform as possible, and it is preferable to always planarize a growing surface of silicon carbide by planarizing an isothermal surface of seed crystal substrate 70S and formed silicon carbide layer (ingot 52). The angle (off angle) of tilt of main surface M70 of seed crystal substrate 70S relative to the (0001) plane may be not less than 0.1° and not more than 15°, for example. The lower limit of the off angle is preferably 1°, and more preferably 2°. The upper limit of the off angle is preferably 10°, and more preferably 8°.

In the above method of manufacturing a silicon carbide substrate, in the step of preparing seed crystal substrate 70S (source material preparing step (S10)), seed crystal substrate 70S having a thickness of not less than 700 μm may be prepared. In order to obtain silicon carbide substrate 80 having a width (diameter) of not less than 100 mm, seed crystal substrate 70S also needs to have a similar (not less than 100 mm) width (diameter). If seed crystal substrate 70S has a small thickness, problems such as shape degradation of seed crystal substrate 70S (e.g., warp) tend to occur. Such shape degradation causes formation of a gap between a surface of the fixing member (pedestal 41) and the back surface of seed crystal substrate 70S when fixing seed crystal substrate 70S inside crucible 42 (e.g., on pedestal 41). Such gap promotes vigorous sublimation at the back surface of seed crystal substrate 70S, causing new defects in resultant silicon carbide ingot 52. Therefore, in order to prevent such shape degradation of seed crystal substrate 70S, the thickness of seed crystal substrate 70S is preferably not less than 700 μm. The thickness of seed crystal substrate 70S is preferably not less than 1 mm, and more preferably not less than 1.3 mm. In the above method of manufacturing a silicon carbide substrate, in the step of growing silicon carbide (crystal growing step (S20)), seed crystal substrate 70S may be fixed on the base member (pedestal 41) in the processing container (processing container 500 or crucible 42 included in processing container 500), and the base member (pedestal 41) may be made of a material having a Young's modulus of not less than 10 GPa, a bending strength of not less than 40 MPa, and a tensile strength of not less than 30 MPa. The base member may have a thickness of not less than 15 mm.

As the growth of silicon carbide progresses in the step of growing silicon carbide (crystal growing step (S20)), stress resulting from the growth of silicon carbide is applied to pedestal 41 having seed crystal substrate 70S fixed thereon. The value of the stress increases as the size of seed crystal substrate 70S (i.e., size of silicon carbide to be formed) increases. If pedestal 41 is deformed due to the stress, the growth conditions of silicon carbide vary, resulting in lowered quality of the resultant silicon carbide (ingot 52). Therefore, in order to prevent deformation of pedestal 41, it is preferable to define mechanical characteristics of the material for pedestal 41 as described above. Pedestal 41 may be made of carbon, or a composite material mainly composed of carbon.

The Young's modulus of the material for the base member (pedestal 41) is set to not less than 10 GPa, in order to realize a base member capable of sufficiently withstanding the stress in accordance with the growth of silicon carbide as described above. The Young's modulus is preferably not less than 12 GPa, and more preferably not less than 14 GPa. The upper limit of the Young's modulus is 20 GPa considering the types of available materials for the base member.

The bending strength of the material for the base member (pedestal 41) is set to not less than 40 MPa, in order to realize a base member capable of sufficiently withstanding the stress in accordance with the growth of silicon carbide as described above. The bending strength is preferably not less than 50 MPa, and more preferably not less than 60 MPa. The upper limit of the bending strength is 100 MPa considering the types of available materials for the base member. The tensile strength of the material for the base member (pedestal 41) is set to not less than 30 MPa, in order to realize a base member capable of sufficiently withstanding the stress in accordance with the growth of silicon carbide as described above. The tensile strength is preferably not less than 40 MPa, and more preferably not less than 50 MPa. The upper limit of the tensile strength is 100 MPa considering the types of available materials for the base member.

In the above method of manufacturing a silicon carbide substrate, the step of preparing a seed crystal substrate (source material preparing step (S10)) may include, as shown in FIG. 6, the step of preparing the plurality of silicon carbide single crystals 70a to 70i each having a main surface, the step of measuring a characteristic value corresponding to the density of defects in each of the plurality of silicon carbide single crystals 70a to 70i by conducting photoluminescence measurement of the main surface of each of silicon carbide single crystals 70a to 70i, and the step of comparing the measured characteristic values obtained in the measuring step with a predetermined criterion to determine any of silicon carbide single crystals 70a to 70i satisfying the criterion as seed crystal substrate 70S.

In this case, a substrate having a sufficiently low defect density can be used as seed crystal substrate 70S, thereby suppressing the occurrence of problems such as degradation of characteristics of silicon carbide that occurs when defects in seed crystal substrate 70S are incorporated into the formed silicon carbide.

Silicon carbide substrate 80 according to the present invention is manufactured with the above method of manufacturing a silicon carbide substrate. In this case, silicon carbide substrate 80 capable of forming a device of excellent performance can be obtained.

(Example)

Samples of a silicon carbide substrate were fabricated in order to confirm the effect of the present invention.

(Preparation of Source Material)

First, a plurality of small pieces of silicon having a diameter of not less than 1 mm and not more than 1 cm, and carbon powder having an average particle size of 200 μm were prepared. The small pieces of silicon were silicon chips having a purity of 99.999999999% used for withdrawing a silicon single crystal.

Next, 1541 g of the small pieces of silicon and 659 g of the carbon powder thus prepared were lightly kneaded, and the resultant mixture was charged into a graphite crucible. The graphite crucible used was heated in advance to 2300° C. in a high-frequency furnace under reduced pressure of 0.013 Pa of argon gas, and maintained for 14 hours.

Next, the graphite crucible into which the mixture of the small pieces of silicon and carbon powder was charged was placed in an electric furnace, and was vacuumed until the pressure of atmosphere temporarily reached 0.01 Pa. Then, the atmosphere gas was replaced with argon gas having a purity of not less than 99.9999%, to set the pressure of atmosphere in the electric furnace to 70 kPa.

Figure 15:
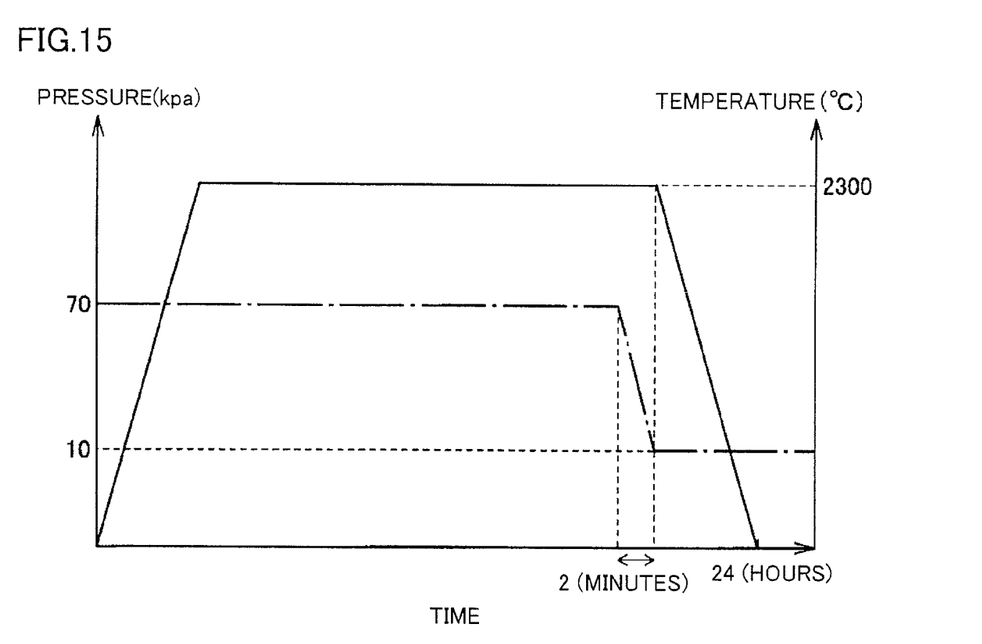
FIG. 15 is a graph showing temporal variations in crucible temperature and pressure in an electric furnace during a heating process.

Next, as shown in FIG. 15, a heating process was performed by controlling the pressure in the electric furnace and the temperature of the graphite crucible. FIG. 15 shows a profile of the temperature of the graphite crucible and the pressure in the electric furnace (pressure of atmosphere) over time. Referring to FIG. 15, a horizontal axis represents time (time period of heating process), a left vertical axis represents pressure (unit: kPa), and a right vertical axis represents the temperature of the graphite crucible (unit: ° C.). In FIG. 15, the pressure of atmosphere in the electric furnace is indicated with a chain-dotted line, and the temperature of the graphite crucible is indicated with a solid line.

In the heating process, as shown in FIG. 15, the graphite crucible containing the mixture of the small pieces of silicon and carbon powder was heated to 2300° C. while the pressure in the electric furnace was maintained at 70 kPa, and was maintained for 20 hours under this temperature condition. Then, the pressure in the electric furnace was reduced to 10 kPa in two minutes. Then, lowering of the temperature of the graphite crucible was started. The temperature of the graphite crucible was lowered to room temperature (25° C.).

Next, a silicon carbide powder precursor produced by the heating process was removed from the graphite crucible. Observation of the silicon carbide powder precursor showed that the silicon carbide powder precursor was an aggregate of a plurality of silicon carbide crystal particles, which was formed of the individual silicon carbide crystal particles connected to one another.

Next, the silicon carbide powder precursor thus obtained was pulverized with a tool coated with a silicon carbide polycrystal, to produce silicon carbide powder. The silicon carbide powder had an average particle size of 20 μm in this example.

Next, the pulverized silicon carbide powder was cleaned with aqua regia. The silicon carbide powder was then cleaned with hydrochloric acid, and was further cleaned with ultra-pure water. After that, the silicon carbide powder was dried.

(Preparation of Seed Crystal Substrate)

As a seed substrate for making an ingot for a seed crystal substrate, a 4H-SiC single crystal substrate having a (000-1) plane that had been subjected to CMP polishing was prepared. This single crystal substrate had a diameter of 150 mm, an off angle of 2 degrees in a [11-20] direction, and a thickness of 1 mm. This single crystal substrate had a micropipe density of 7 $cm^{-2}$, a threading screw dislocation density of $1 \times 10^4$ $cm^{-2}$, a threading edge dislocation density of $3 \times 10^4$ $cm^{-2}$, and a basal plane dislocation density of $3 \times 10^4$ $cm^{-2}$. In the present specification, an individual plane orientation is indicated with (hkil), and a collective plane orientation including (hkil) and its equivalent plane orientation in terms of crystal geometry is indicated with {hkil}. An individual direction is indicated with [hkil], and a direction including [hkil] and its equivalent direction in terms of crystal geometry is indicated with <hkil>. Although "—" (bar) is generally attached atop a numeral indicating a negative index in terms of crystal geometry, a negative sign (−) is attached before a numeral indicating an index in the present specification.

Next, as shown in FIG. 12, the seed crystal substrate was fixed on pedestal 41 (see FIG. 12). In addition, the silicon carbide powder was placed in crucible 42 made of carbon (see FIG. 12). Then, as shown in FIG. 12, pedestal 41 having the seed crystal substrate fixed thereon was arranged above crucible 42, and crucible 42 was placed in a heater. Then, heating was performed at a pressure of 1 kPa of a mixed atmosphere of argon and nitrogen, so that the temperature of a lower portion of the crucible reached 2400° C. and the temperature of an upper portion of the crucible reached 2100° C. The argon and nitrogen had a partial pressure ratio of 3:1. Heating was performed for 100 hours under these conditions, to fabricate a single crystal ingot of silicon carbide having a diameter of 150 mm and a height of 30 mm.

After the ingot was fabricated, the ingot was sliced into a substrate having thickness of 1 mm with an off angle of 2 degrees in the [11-20] direction relative to the (0001) plane, namely, in parallel to the seed substrate. After the slicing, the (000-1) plane of the cut substrate (seed crystal substrate) was ground, and polished successively by MP polishing and CMP polishing. After the polishing, various defects in the seed crystal substrate were evaluated using a PL imaging device. As a result, it was confirmed that the seed crystal substrate that was subjected to evaluation had a micropipe density of 5 $cm^{-2}$, a threading screw dislocation density of $5 \times 10^3$ $cm^{-2}$, a threading edge dislocation density of $1 \times 10^4$ $cm^{-2}$, and a basal plane dislocation density of $1 \times 10^4$ $cm^{-2}$.

(Conditions for Crystal Growing Step)

As shown in FIG. 12, the seed crystal substrate was fixed on pedestal 41 (see FIG. 12). In addition, the silicon carbide powder was placed in crucible 42 made of carbon (see FIG. 12). Then, as shown in FIG. 12, pedestal 41 having the seed crystal substrate fixed thereon was arranged above crucible 42, and crucible 42 was placed in a heater. Then, heating was performed at a pressure of 1 kPa of a mixed atmosphere of argon and nitrogen, so that the temperature of a lower portion of the crucible reached 2400° C. and the temperature of an upper portion of the crucible reached 2100° C. The argon and nitrogen had a partial pressure ratio of 3:1. Heating was performed for 100 hours under these conditions, to fabricate a single crystal ingot of silicon carbide having a diameter of 150 mm and a height of 30 mm.

(Conditions for Processing Step)

After the ingot was fabricated, the ingot was sliced into a substrate having thickness of 0.7 mm with an off angle of 4 degrees in the [11-20] direction relative to the (0001) plane. After the slicing, the (0001) plane of the cut substrate was ground, and polished successively by MP polishing and CMP polishing. As a result, a silicon carbide single crystal substrate having a diameter of 150 mm and a thickness of 0.6 mm was obtained.

(Measurement Methods)

As to the micropipe, threading screw dislocation, threading edge dislocation and basal plane dislocation, the densities of these defects were evaluated by molten KOH etching and etch pit observation with a microscope on a surface of the silicon carbide single crystal substrate. Likewise, the stacking fault was evaluated by molten KOH etching and etch pit observation with a microscope on the silicon carbide single crystal substrate. The conductive impurity concentration and residual impurity concentration were evaluated by SIMS analysis. The secondary phase inclusion density was evaluated by microscopic observation with back surface irradiation.

(Results)

As a result of the measurements described above, the silicon carbide single crystal substrate had a micropipe density of 0.1 cm$^{-2}$, a threading screw dislocation density of 5×10$^3$ cm$^{-2}$, a threading edge dislocation density of 1×10$^4$ cm$^{-2}$, a basal plane dislocation density of 1×10$^4$ cm$^{-2}$, a stacking fault density of 0 cm$^{-1}$, a conductive impurity concentration of 5.0×10$^{18}$ cm$^{-3}$, a residual impurity concentration of 5×10$^{15}$ cm$^{-3}$, and a secondary phase inclusion density of 0.1 cm$^{-3}$.

The present invention is advantageously applicable particularly to a silicon carbide substrate having a diameter of not less than 100 mm.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A silicon carbide substrate made of a single crystal of silicon carbide, and having
    a width of not less than 100 mm, a micropipe density of not more than 7 cm$^{-2}$, a threading screw dislocation density of not more than 1×10$^4$ cm$^{-2}$, a threading edge dislocation density of not more than 1×10$^4$ cm$^{-2}$, a basal plane dislocation density of not more than 1×10$^4$ cm$^{-2}$, a stacking fault density of not more than 0.1 cm$^{-1}$, a conductive impurity concentration of not less than 1×10$^{18}$ cm$^{-3}$, a residual impurity concentration of not more than 1×10$^{16}$ cm$^{-3}$, and a secondary phase inclusion density of not more than 1 cm$^{-3}$.

2. The silicon carbide substrate made of a single crystal of silicon carbide according to claim 1, wherein
    said micropipe density is not more than 5 cm$^{-2}$.

3. The silicon carbide substrate made of a single crystal of silicon carbide according to claim 1, wherein
    said width is not less than 120 mm.

4. A silicon carbide substrate made of a single crystal of silicon carbide, and having
    a width of not less than 150 mm, a micropipe density of not more than 7 cm$^{-2}$, a threading screw dislocation density of not more than 1×10$^4$ cm$^{-2}$, a threading edge dislocation density of not more than 1×10$^4$ cm$^{-2}$, a basal plane dislocation density of not more than 1×10$^4$ cm$^{-2}$, a stacking fault density of not more than 0.1 cm$^{-1}$, a conductive impurity concentration of not less than 1×10$^{18}$ cm$^{-3}$, a residual impurity concentration of not more than 1×10$^{16}$ cm$^{-3}$, and a secondary phase inclusion density of not more than 1 cm$^{-3}$.

5. A silicon carbide substrate made of a single crystal of silicon carbide, and having
    a width of not less than 100 mm, a micropipe density of not more than 3 cm$^{-2}$, a threading screw dislocation density of not more than 1×10$^4$ cm$^{-2}$, a threading edge dislocation density of not more than 1×10$^4$ cm$^{-2}$, a basal plane dislocation density of not more than 1×10$^4$ cm$^{-2}$, a stacking fault density of not more than 0.1 cm$^{-1}$, a conductive impurity concentration of not less than 1×10$^{18}$ cm$^{-3}$, a residual impurity concentration of not more than 1×10$^{16}$ cm$^{-3}$, and a secondary phase inclusion density of not more than 1 cm$^{-3}$.

6. The silicon carbide substrate made of a single crystal of silicon carbide according to claim 5, wherein
    said stacking fault density is not more than 0.03 cm$^{-1}$.

7. The silicon carbide substrate made of a single crystal of silicon carbide according to claim 5, wherein
    said conductive impurity concentration is not less than 5×10$^{18}$ cm$^{-3}$.

8. The silicon carbide substrate made of a single crystal of silicon carbide according to claim 5, wherein
    said stacking fault density is not more than 0.03 cm$^{-1}$, and
    said conductive impurity concentration is not less than 5×10$^{18}$ cm$^{-3}$.

9. A silicon carbide substrate made of a single crystal of silicon carbide, and having
    a width of not less than 150 mm, a micropipe density of not more than 5 cm$^{-2}$, a threading screw dislocation density of not more than 1×10$^4$ cm$^{-2}$, a threading edge dislocation density of not more than 1×10$^4$ cm$^{-2}$, a basal plane dislocation density of not more than 1×10$^4$ cm$^{-2}$, a stacking fault density of not more than 0.1 cm$^{-1}$, a conductive impurity concentration of not less than 1×10$^{18}$ cm$^{-3}$, a residual impurity concentration of not more than 1×10$^{16}$ cm$^{-3}$, and a secondary phase inclusion density of not more than 1 cm$^{-3}$.

10. A silicon carbide substrate made of a single crystal of silicon carbide, and having
    a width of not less than 150 mm, a micropipe density of not more than 3 cm$^{-2}$, a threading screw dislocation density of not more than 1×10$^4$ cm$^{-2}$, a threading edge dislocation density of not more than 1×10$^4$ cm$^{-2}$, a basal plane dislocation density of not more than 1×10$^4$ cm$^{-2}$, a stacking fault density of not more than 0.1 cm$^{-1}$, a conductive impurity concentration of not less than 1×10$^{18}$ cm$^{-3}$, a residual impurity concentration of not more than 1×10$^{16}$ cm$^{-3}$, and a secondary phase inclusion density of not more than 1 cm$^{-3}$.

11. The silicon carbide substrate made of a single crystal of silicon carbide according to claim 10, wherein
    said stacking fault density is not more than 0.03 cm$^{-1}$.

12. The silicon carbide substrate made of a single crystal of silicon carbide according to claim 10, wherein
    said conductive impurity concentration is not less than 5×10$^{18}$ cm$^{-3}$.

13. The silicon carbide substrate made of a single crystal of silicon carbide according to claim 10, wherein
    said stacking fault density is not more than 0.03 cm$^{-1}$, and
    said conductive impurity concentration is not less than 5×10$^{18}$ cm$^{-3}$.

* * * * *